US008989593B2

(12) United States Patent
Sun et al.

(10) Patent No.: US 8,989,593 B2
(45) Date of Patent: Mar. 24, 2015

(54) FREQUENCY DOMAIN CLOCK RECOVERY (75) Inventors: Han Henry Sun, Ottawa (CA);
Kuang-Tsan Wu, Kanata (CA)

(73) Assignee: Infinera Corporation, Sunnyvale, CA (US)

( * ) Notice: Subject to any disclaimer, the term of this patent is extended or adjusted under 35 U.S.C. 154(b) by 596 days.

(21) Appl. No.: 12/961,236

(22) Filed: Dec. 6, 2010

(65) Prior Publication Data
US 2012/0086492 A1    Apr. 12, 2012

Related U.S. Application Data (60) Provisional application No. 61/391,376, filed on Oct. 8, 2010.

(51) Int. Cl.
*H04B 10/00* (2013.01)
*H03D 13/00* (2006.01)
*H04B 10/61* (2013.01)

(52) U.S. Cl.
CPC ........... *H04B 10/6161* (2013.01); *H03D 13/00* (2013.01); *H04B 10/6165* (2013.01)
USPC ............................. 398/155; 398/203; 398/204

(58) Field of Classification Search
CPC .... H04B 10/61; H04B 10/614; H04B 10/615; H04B 10/616; H04B 10/63
USPC .......................................... 398/202–214, 155
See application file for complete search history.

(56) References Cited

U.S. PATENT DOCUMENTS

| 7,532,822 | B2 | 5/2009 | Sun et al. | |
| 7,899,340 | B1 * | 3/2011 | Bontu et al. | 398/209 |
| 2010/0120389 | A1 * | 5/2010 | Blum | 455/208 |
| 2010/0329697 | A1 * | 12/2010 | Koizumi et al. | 398/208 |
| 2011/0150503 | A1 * | 6/2011 | Winzer | 398/202 |
| 2013/0039665 | A1 * | 2/2013 | Hauske | 398/202 |

OTHER PUBLICATIONS

F. N. Hauske, et.al., "Impact of Optical Channel Distortions to Digital Timing Recovery in Digital Coherent Transmission Systems", ICTON 2010, We.D1.4.
Maxim Kuschnerov, "DSP for Coherent Single-Carrier Receivers", J. Lightwave Tech. vol. 27, No. 16, Aug. 15, 2009.

(Continued)

*Primary Examiner* — Dzung Tran
(74) *Attorney, Agent, or Firm* — David L. Soltz (57) ABSTRACT

Consistent with an aspect of the present disclosure, an optical signal carrying data or information is supplied to photodetector circuitry that generates a corresponding analog signal. The analog signal may be amplified or otherwise processed and supplied to analog-to-digital conversion (ADC) circuitry, which samples the analog signal to provide a plurality of digital signals or samples. The timing of such sampling is in accordance with a clock signal supplied to the ADC circuitry. A phase detector is provided that detects and adjust the clock signal to have a desired phase based on frequency domain data that is output from a Fast Fourier transform (FFT) circuit that receives the digital samples. Preferably, the phase detector circuit is configured such that it need not receive all the frequency domain data output from the FFT at any given time in order to determine the clock phase. Rather, a subset of such data is supplied to the phase detector circuit, such that the phase detector has a simpler design, operates faster, and is computationally efficient.

11 Claims, 9 Drawing Sheets

(56) References Cited

OTHER PUBLICATIONS

K. Roberts, et al, "Performance of dual-polarization QPSK for optical transport systems," JLT, vol. 27, No. 16, pp. 3546-3559, Aug. 2009.

Michael G. Taylor, "Coherent Detection Method Using DSP for Demodulation of Signal and Subsequent Equalization of Peopagation Impairments," IEEE Photonics Technology Letters, vol. 16, No. 2, Feb. 2004, pp. 674-676.

F. Gardner, "A BPSK/QPSK Timing-Error Detector for Sampled Receivers", IEEE Trans. Comm., vol. 134, issue 5, 1986, p. 423-429.

D. Godard, "Passband Timing Recovery in an All-Digital Modem Receiver", IEEE Comm., vol. 26, issue 5, 1978, p. 517-523.

K. Mueller, M. Muller, "Timing Recovery in Digital Synchronous Data Receivers", IEEE Trans. Comm., vol com-24, No. 5, May 1976.

L. E.Franks, "Statistical Properties of Timing Jitter in a PAM Timing Recovery Scheme", IEEE Trans. On Comm., vol com-22, No. 7, Jul. 1974, p. 913.

J. Proakis, "Digital Communications", 2nd Edition, 1983, Ch. 4.5: Carrier and Symbol Synchronization.

S.J. Savory, et al, "Digital equalisation of 40Gbit/s per wavelength transmission over 2480 km of standard fibre without optical dispersion compensation, " ECOC 2006, paper Th2.5.5.

H. Sun, et al, "Real-time measurements of a 40 Gb/s coherent system," Opt. Express 16, 2008, pp. 873-879.

L.E. Franks, "Carrier and Bit Synchronization in Data Communication—A Tutorial Review", IEEE Trans. Comm., volume com-28, No. 8, Aug. 1980.

* cited by examiner

FREQUENCY DOMAIN CLOCK RECOVERY

The present application claims the benefit of U.S. Provisional Application No. 61/391,376 filed on Oct. 8, 2010, the entire contents of which are incorporated herein by reference.

BACKGROUND

Coherent optical communication systems are known in which an optical signal is transmitted on an optical fiber from a transmitter to a receiver. In the receiver, the optical signal or a portion thereof is mixed with a local oscillator optical signal and converted to an analog electrical signal by photodetector circuitry. The analog signal may then be amplified or otherwise processed and then sampled by analog-to-digital conversion (ADC) circuitry to supply corresponding digital samples. The digital samples may then be supplied to a digital signal processor (DSP), including serializer-deserializer (SERDES) circuitry that may provide a serial output data stream corresponding to data carried by the optical signal.

Typically, the optical signal carries data as a series of bits of information, and these bits are grouped into symbols, such that a series of such symbols are received by the receiver. Each symbol is transmitted over a given time frame referred to as a symbol period (Ts), and the rate at which the symbols are transmitted is 1/Ts and may also be referred to as the symbol frequency or baud rate (fbaud). Often, the timing of the ADC sampling (or the sampling frequency or sampling rate) is such that multiple samples, such as two, are taken during the symbol period in order to adequately detect or recover each symbol, for example, in accordance with the so-called Nyquist Theorem. Accordingly, the ADC sampling is preferably adjusted in accordance with a clock signal, which is timed so that the two samples are taken during each symbol period, instead of, for example, the samples being taken from different symbol periods. The clock signal may also be used to time the input of the digital samples to the SERDES circuitry, so that the samples may be processed in a synchronized manner.

As generally understood, the optical signal may be subject to various impairments during transmission, such as chromatic dispersion (CD), in which different frequency components of the optical signal may propagate at different speeds along the optical fiber. As a result, a portion of the optical signal associated with a preceding symbol may be received at the receiver at the same time as another portion of the optical signal associated with a succeeding symbol, thereby resulting in errors in the detected data. Accordingly, known techniques may be implemented in the DSP to correct or compensate for CD. In one such technique, a known Fast Fourier transform (FFT) circuit is provided to convert the digital samples into frequency domain data including frequency components, which may be appropriately filtered with a known finite-impulse-response (FIR) filter to reduce or eliminate those frequency components associated with CD. The frequency domain data may then be converted back to time domain data with a known inverse FFT (IFFT) to supply time domain, chromatic dispersion compensated, data to the SERDES. Processing of frequency domain data, as noted above, is known to have certain advantages.

Phase detector circuits that process time domain data to determine a phase between the clock signal and the sampling frequency are known. For example, such phase detector circuits may implement a so-called Gardner algorithm. Since FFT circuits may be readily implemented, it would be beneficial to realize a computationally efficient phase detector circuit that operates on frequency domain data supplied by such FFT circuits.

SUMMARY

Consistent with the present disclosure, an apparatus is provided that includes a first input receiving first data including a first plurality of values, and a second input receiving second data including a second plurality of values. First and second adders are also provided. The first adder is configured to add the first data to the second data to generate a first output corresponding to a sum of the first and second data, and the second adder is configured to add the first data to negated second data to generate a second output corresponding to a difference between the first and second data. A conjugating circuit is included that is configured to generate a third output corresponding to a conjugation of the sum of the first and second data. In addition, a first multiplier circuit is provided that is configured to generate a fourth output indicative of a product of an imaginary number and the difference between the first and second data, and a second multiplier circuit is provided that is configured to generate a fifth output indicative of a product of the third and fourth outputs. The fifth output is also indicative of a plurality real values. Further a summation circuit is included that is configured to provide a sixth output indicative of a summation of the plurality of real values.

Consistent with an additional aspect of the present disclosure, an apparatus is provided that includes a photodetector circuitry configured to receive an optical signal and supply an analog electrical signal. The optical signal carries a series of symbols, which constitute an information signal. Analog-to-digital conversion (ADC) conversion circuitry is also provided that is configured to supply a digital signal in accordance with the analog electrical signal and a sampling frequency. The digital signal carries time domain data. In addition, a Fourier transform circuit is provided that is configured to supply a frequency domain data in accordance with the digital signal, and a phase detector circuit is provided that supplies an output indicative of a phase between with the clock signal and the information signal. The output is supplied in response to the frequency domain data. Further, a clock circuit is provided that is configured to supply the clock signal in accordance with the output of the phase detector circuit.

Consistent with a further aspect of the present disclosure, an apparatus is provided that receives an optical signal carrying data. The apparatus includes a Fourier transform circuit configured to supply a frequency domain data in response to a time domain data, the time domain data including a series of symbols constituting an information signal. In addition, a phase detector circuit is provided that is configured to supply an output indicative of a phase between a clock signal and the information signal, the output being supplied in response to the frequency domain data. Moreover, a clock circuit is provided that is configured to supply the clock signal in accordance with the output of the phase detector circuit.

Additional objects and advantages will be set forth in part in the description which follows, and in part will be apparent from the description. It is to be understood that both the foregoing general description and the following detailed description are exemplary and explanatory only and are not restrictive of the invention, as claimed.

The accompanying drawings, which are incorporated in and constitute a part of this specification, illustrate embodiments of the disclosure and together with the description, serve to explain the principles of the disclosure.

DESCRIPTION OF THE EMBODIMENTS

Consistent with an aspect of the present disclosure, an optical signal carrying data or information is supplied to photodetector circuitry that generates a corresponding analog signal. The analog signal may be amplified or otherwise processed and supplied to analog-to-digital conversion (ADC) circuitry, which samples the analog signal to provide a plurality of digital signals or samples. The timing of such sampling is in accordance with a clock signal supplied to the ADC circuitry. A phase detector is provided that detects and adjusts the clock signal to have a desired phase based on frequency domain data that is output from a Fast Fourier transform (FFT) circuit that receives the digital samples. In accordance with the present disclosure, the phase detector circuit is configured such that it need not receive all the frequency domain data output from the FFT at any given time in order to determine the clock phase. Rather, a subset of such data is supplied to the phase detector circuit, such that the phase detector has a simpler design, operates faster, and is computationally efficient.

Reference will now be made in detail to the present exemplary embodiments of the present disclosure, which are illustrated in the accompanying drawings. Wherever possible, the same reference numbers will be used throughout the drawings to refer to the same or like parts.

Figure 1:
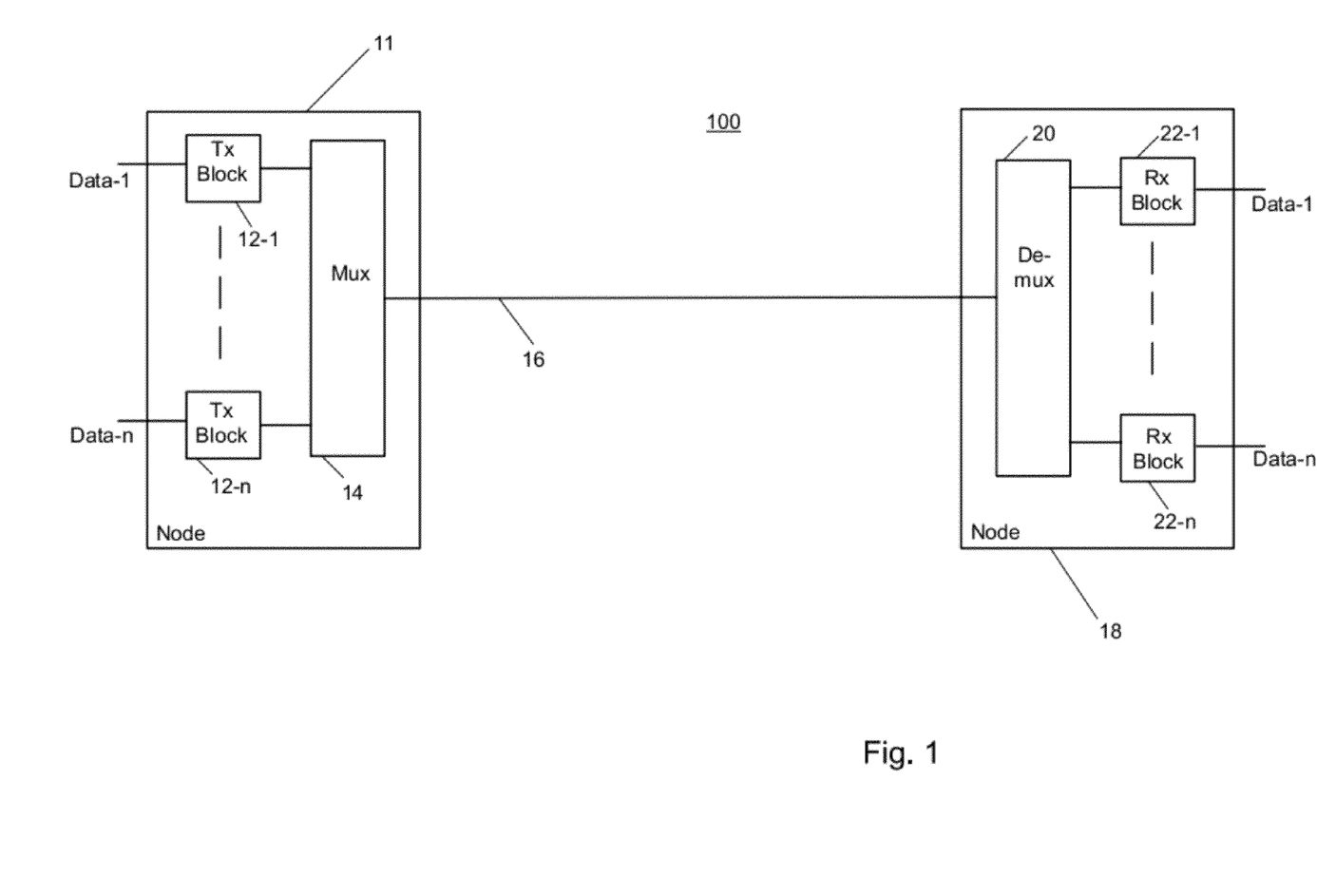
FIG. 1 illustrates an optical communication system consistent with the present disclosure.

FIG. 1 illustrates an optical link or optical communication system 100 consistent with an aspect of the present disclosure. Optical communication system 100 includes a plurality of transmitter blocks (Tx Block) 12-1 to 12-n provided in a transmit node 11. Each of transmitter blocks 12-1 to 12-n receives a corresponding one of a plurality of data or information streams Data-1 to Data-n, and, in response to a respective one of these data streams, each of transmitter blocks 12-1 to 12-n may output a group of optical signals or channels to a combiner or multiplexer 14. Each optical signal carries an information stream or data corresponding to each of data streams Data-1 to Data-n. In particular, each optical signal may carry a series of symbols constituting an information signal. Multiplexer 14, which may include one or more optical filters, for example, combines each group of optical signals onto optical communication path 16. Optical communication path 16 may include one or more segments of optical fiber and optical amplifiers, for example, to optically amplify or boost the power of the transmitted optical signals. In one example, optical signals output from transmitter block 12-1 to 12-n may be polarization multiplexed optical signals that are modulated in accordance with a known modulation format, such as quadrature phase shift keying (QPSK), binary phase shift keying (BPSK) or combinations of such modulation formats, e.g., certain optical signals may have a first modulation format, while others have a second, different modulation format.

As further shown in FIG. 1, a receive node 18 is provided that includes an optical combiner or demultiplexer 20, which may include one or more optical filters, for example, optical demultiplexer 20 supplies each group of received optical signals to a corresponding one of receiver blocks (Rx Blocks) 22-1 to 22-n. Each of receiver blocks 22-1 to 22-n, in turn, supplies a corresponding copy of data or information streams Data-1 to Data-n in response to the optical signals. It is understood that each of transmitter blocks 12-1 to 12-n has the same or similar structure and each of receiver blocks 22-1 to 22-n has the same or similar structure.

Figure 2:
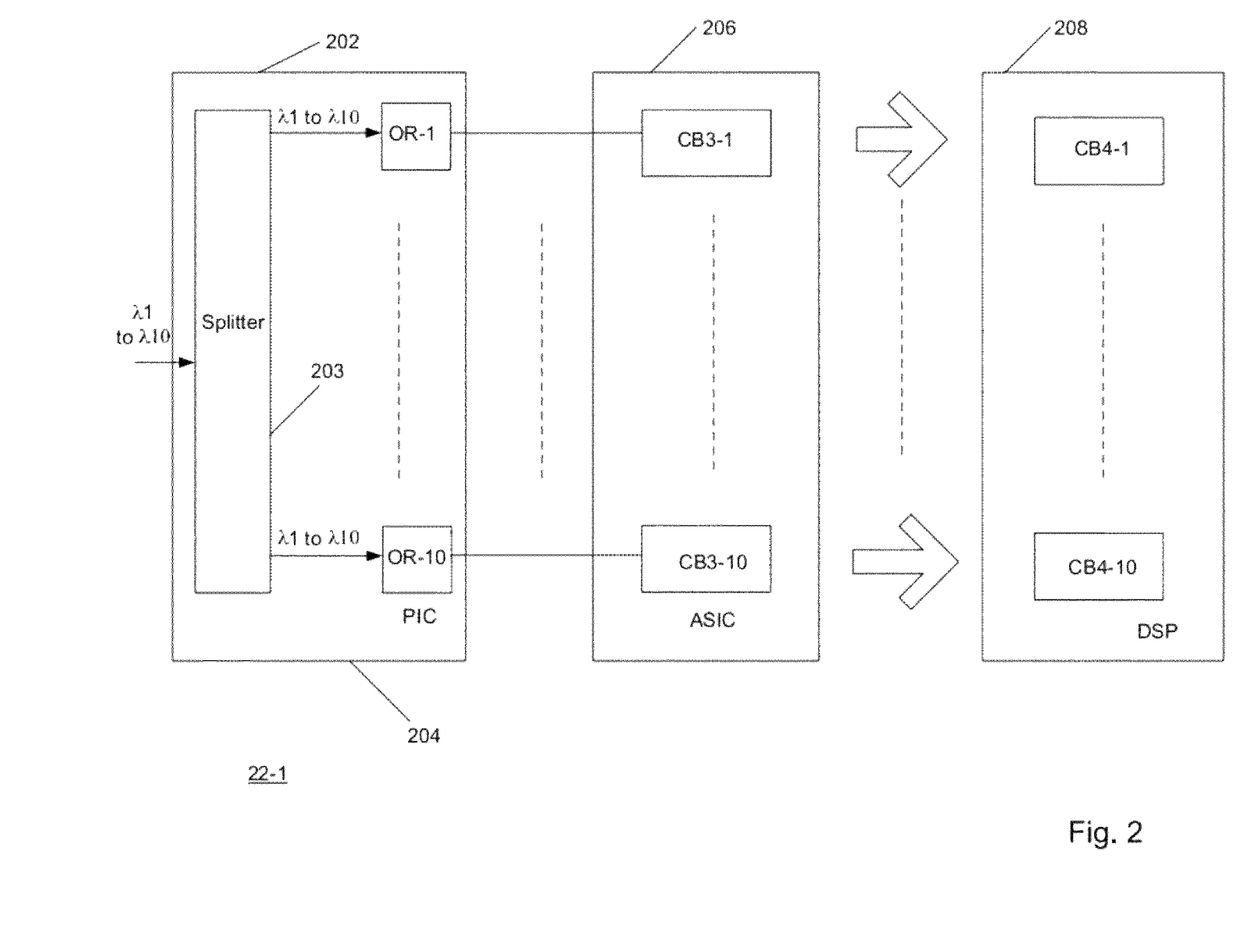
FIG. 2 illustrates a receiver block consistent with an aspect of the present disclosure.

One of receiver blocks 22-1 is shown in greater detail in FIG. 6. It is understood that remaining receiver circuitry or blocks 22-2 to 22-n have the same or similar structure as receiver block 22-1.

Receiver block 22-1 may include a receive photonic integrated circuit (PIC) 202 provided on substrate 204. PIC 202 includes an optical power splitter 203 that receives optical signals having wavelengths $\lambda 1$ to $\lambda 10$, for example, and supplies a power split portion of each optical signal (each of which itself may be considered an optical signal) to each of optical receivers OR-1 to OR-10. Alternatively, splitter 203 may be replaced by a known optical demultiplexer, such as a de-interleaver, that has an input that receives optical signals having wavelengths $\lambda 1$ to $\lambda 10$, and supplies each optical signal at a corresponding one of a plurality of outputs. It is understood that, consistent with the present disclosure, the number of optical signals, and thus, the number of wavelengths, is not limited to the specific numbers of optical signals and wavelengths discussed herein. Rather, any appropriate number of optical signals and wavelengths, as well as transmitters and receivers, may be provided in accordance with the present disclosure.

Returning to FIG. 2, each optical receiver OR-1 to OR-10, in turn, supplies a corresponding output to a respective one of circuit blocks CB3-1 to CB3-10 of ASIC 206, and each of circuit blocks CB3-1 to CB3-10, supplies a respective output to a corresponding one of circuit blocks CB4-1 to CB4-10 of DSP 208. DSP 208, in turn, outputs a copy of data Data-1 or a portion thereof in response to the input to circuit blocks CB4-1 to CB4-10.

Figure 3:
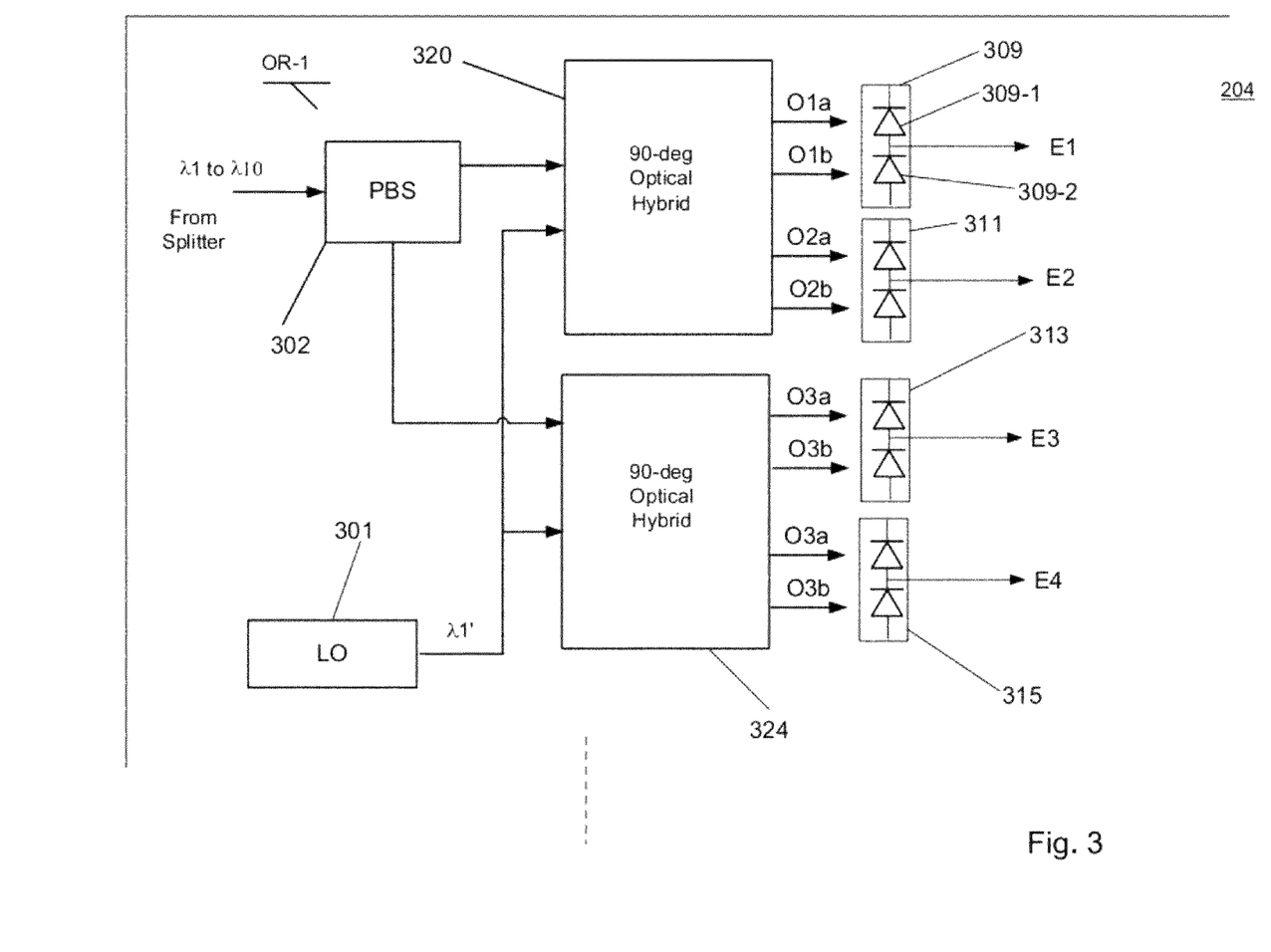
FIG. 3 illustrates an optical receiver consistent with the present disclosure.

Optical receiver OR-1 is shown in greater detail in FIG. 3. It is understood that remaining optical receivers OR-2 to OR-10 have the same or similar structure as optical receiver OR-1. Optical receiver OR-1 may include a polarization beam splitter (PBS) 302 operable to receive polarization multiplexed optical signals $\lambda 1$ to $\lambda 10$ and to separate the signal into X and Y orthogonal polarizations (first light having a first polarization and carrying a first portion of the information carried by an optical signal at wavelength $\lambda 1$, for example, and second light having a second polarization and carrying a second portion of the information carried by the optical signal at wavelength $\lambda 1$), i.e., vector components of the optical E-field of the incoming optical signals transmitted on optical fiber medium 108. The orthogonal polarizations are then mixed in 90 degree optical hybrid circuits ("hybrids") 320 and 324 with light from local oscillator (LO) laser 701 having wavelength λ1' which is sufficient to "beat", in a known manner, with light having one of wavelengths λ1 to λ10. Hybrid circuit 320 outputs four optical signals O1a, O1b, O2a, O2b and hybrid circuit 324 outputs four optical signals O3a, O3b, O4a, and O4b, each representing the in-phase and quadrature components of the optical E-field on X (TE) and Y (TM) polarizations, and each including light from local oscillator 301 and light from polarization beam splitter 302. Optical signals O1a, O1b, O2a, O2b, O3a, O3b, O4a, and O4b are supplied to a respective one of photodetector circuits 309, 311, 313, and 315. Each photodetector circuit includes a pair of photodiodes (such as photodiodes 309-1 and 309-2) configured as a balanced detector, for example, and each photodector circuit supplies a corresponding one of electrical signals E1, E2, E3, and E4, each of which being an analog electrical signal, for example. Alternatively, each photodetector may include one photodiode (such as photodiode 309-1) or single-ended photodiode.

Analog electrical signals E1 to E4 are indicative of data carried by one of optical signals λ1 to λ10 input to PBS 702. For example, these electrical signals may comprise four baseband analog electrical signals linearly proportional to the in-phase and quadrature components of the optical E-field on X and Y polarizations, i.e., the information carried by the first light having a first X (TE) polarization and second light carried by the second Y (TM) polarization. Typically, the information constitutes a first series of symbols carried by the first light and a second series of symbols carried by the second light.

Figure 4:
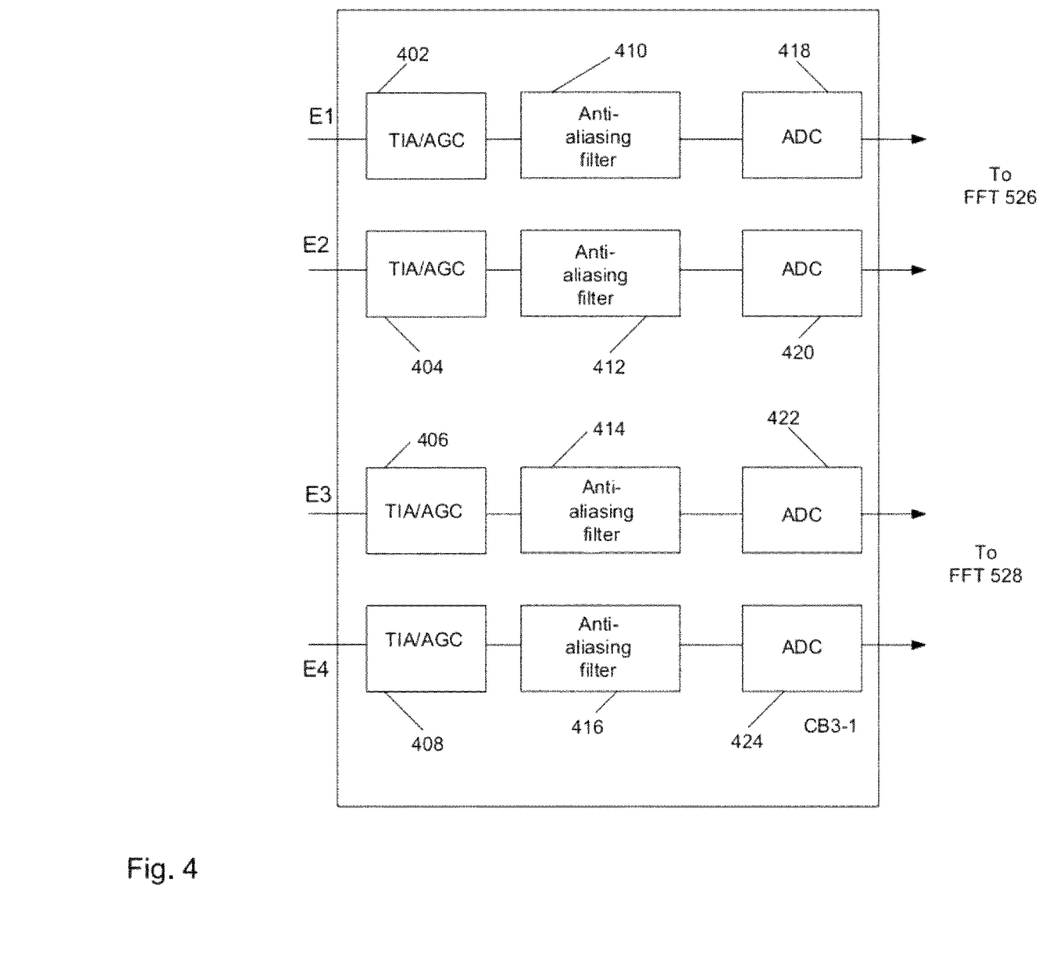
FIG. 4 illustrates a circuit block consistent with the present disclosure.

FIG. 4 shows circuitry or circuit blocks CB3-1 in greater detail. It is understood that remaining circuit blocks CB3-2 to CB3-10 of ASIC 206 have a similar structure and operate in a similar manner as circuit block CB3-1. Circuit block CB3-1 includes known transimpedance amplifier and automatic gain control (TIA/AGC 802) circuitry 402, 404, 406, and 408 that receives a corresponding one of electrical signals E1, E2, E3, and E4. Circuitry 402, 404, 406, and 408, in turn, supplies corresponding electrical signals or outputs to respective ones of anti-aliasing filters 410, 412, 414, and 415, which, constitute low pass filters that further block, suppress, or attenuate high frequency components due to known "aliasing". The electrical signals or outputs from filters 410, 412, 414, and 416 are then supplied to corresponding ones of analog-to-digital converters (ADCs) 418, 420, 422, and 424, which, in turn, supply each of a corresponding digital signal including a plurality digital samples. The digital signals are typically in the time domain and carry time domain data. The time domain data may include or be indicative of, for example, the first and second series of symbols noted above.

Preferably, ADCs 418, 420, 422, and 424, may sample the outputs of anti-aliasing filters 410, 412, 414, and 416, respectively, at a relatively high rate to provide discrete time domain data samples. At such a high sampling rate, DSP 208 and its associated circuitry or circuits, would consume excessive power and would require a relatively complex design. Accordingly, in order to reduce the rate that samples are supplied to and processed by DSP 208, first-in-first-out (FIFO) interpolation and filter circuits may be provided to provide samples at a lower sampling rate than that associated with ADCs 418, 420, 422, and 424, i.e., the interpolation and filter circuits may provide "downsampling." The operation and structure of FIFO interpolation and filter circuits are described in greater detail in U.S. patent application Ser. No. 12/791,694 titled "Method, System, And Apparatus For Interpolating An Output Of An Analog-To-Digital Converter", filed Jun. 1, 2010, the entire contents of which are incorporated herein by reference.

Figure 5:
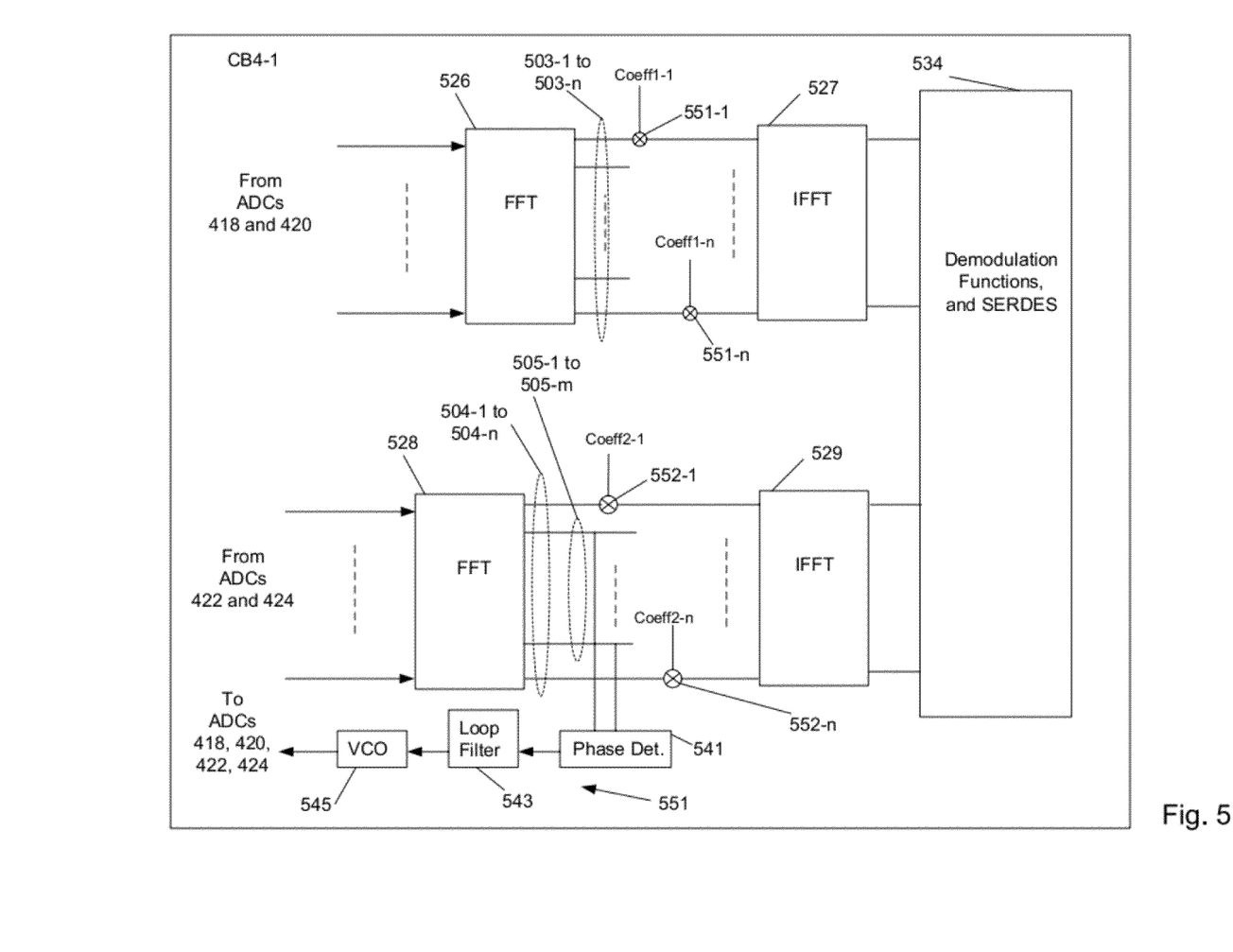
FIG. 5 illustrates an additional circuit block consistent with the present disclosure.

FIG. 5 illustrates a portion of circuit block CB4-1 in greater detail. It is understood that remaining circuit blocks CB4-2 to CB4-10 of DSP 208 have a similar structure and operating in a similar manner as circuit block CB4-1. Circuit block CB4-1 includes a Fourier transform circuit or circuitry including Fourier transform circuits or blocks 526 and 528. Both Fourier transform circuits or blocks 526 and 528 may include fast Fourier transform circuitry, for example. Fourier transform block 526 receives digital signals carrying time domain data from ADC circuits 418 and 420, and Fourier transform block 528 receives digital signals carrying time domain data from ADC circuits 422 and 424. In response to or in accordance with the received digital signals, Fourier transform block 526 supplies first frequency domain data on outputs 503-1 to 503-n in a known manner, and such frequency domain data is associated with the first light output from PBS 302 having an X (TE) polarization (or a first portion of the optical signal input to PBS 302). In addition, Fourier transform block 528 supplies second frequency domain data on outputs 504-1 to 504-n associated with the second light output from PBS 302 having a Y (TM) polarization (or a second portion of the optical signal input to PBS 302). Each of outputs 503-1 to 503-n supplies a respective one of a first plurality of components (frequency components) of the frequency domain data, and each of outputs 504-1 to 504-n supplies a respective one of a second plurality of components (frequency components) of the frequency domain data.

Each of outputs 503-1 to 503-n is coupled or connected to a corresponding one of multiplier circuits 551-1 to 551-n, which multiply a frequency domain data component carried by each such output by a corresponding one of coefficients Coeff1-1 to Coeff1-n, to thereby filter or equalize each frequency domain data component in a known manner. Such filtering or equalization may be employed to offset or compensate for distortions or impairments in the received data that result from chromatic dispersion, for example. The resulting products from each of multiplier circuits 551-1 to 551-n are fed to an inverse Fourier transform block 527 (which may include inverse fast Fourier transform circuitry), which operates or processes such products in a known manner to provide time domain data. Such time domain data is provided to circuit block 534, which may perform known demodulation functions, as well as a serializing-deserializing (SERDES) operations to thereby output a stream of data, such as a portion of data stream Data1.

As further shown in FIG. 5, each of outputs 504-1 to 504-n is coupled or connected to a corresponding one of multiplier circuits 552-1 to 552-n, which multiply a frequency domain data component carried by each such output by a corresponding one of coefficients Coeff2-1 to Coeff2-n, to thereby filter or equalize each frequency domain data component in a known manner (similar to that noted above with respect to multiplier circuits 551-1 to 551-n). As further noted above, such filtering or equalization may be employed to offset or compensate for distortions or impairments in the received data that result from chromatic dispersion. The resulting products from each of multiplier circuits 552-1 to 552-n are fed to an inverse Fourier transform block 529 (which may include inverse fast Fourier transform circuitry), which operates or processes such products in a known manner to provide additional time domain data. Such additional time domain data is provided to circuit block 534, which, as noted above, may perform known demodulation functions, as well as serializing-deserializing (SERDES) operations to thereby output an additional data stream, such as an additional portion of data stream Data1, for example.

As further shown in FIG. 5, a subset of outputs 504-1 to 504-n, namely outputs 505-1 to 505-n, also supply frequency domain data components to a phase detector circuit 541. As discussed in greater detail below, in response to such frequency domain data components, phase detector circuit 541 supplies an output indicative of a phase between a clock signal used to time the sampling of ADC circuits 418, 420, 422, and 424 and the information signal carried by one of the optical signals discussed above. The output from phase detector circuit 541 is provided to a low pass filter or "loop filter" 543, which may remove noise present in the phase detector output. Loop filter 543, in turn, supplies an input to a voltage controlled oscillator (VCO) 545, which supplies a clock signal with an appropriate frequency to properly time the sampling by ADC circuits 418, 420, 422, and 424 based on the output from phase detector circuit 541.

Phase detector circuit 541 may be a circuit implementation of an algorithm, a derivation of which will next be described below.

As noted above, the "Gardner phase detector" is a known phase detection algorithm based on time domain data. In equation [1] (Eqn[1]), X[n] (n=0, 1, 2 ... N−1) is the discrete time domain data samples noted above, which have been sampled at two samples per symbol by the ADC circuits, such as one or more of circuits 418, 420, 422, and 424.

$$\tau_{err} = \sum_{n=0}^{N/2-1} [x(2n-1) - x(2n+1)] \cdot x^*(2n) \qquad \text{Eqn[1]}$$

In Eqn[2] below, X[2n] can be represented in the frequency domain as (using a known sampling theorem, 2x down-sampling (i.e., of the ADC outputs noted above, but by a factor of two), and the double arrow indicate translation from time domain to freq domain, n, the index of the time domain samples, and k, the index the freq domain samples, x[n] has a total of N samples and x[2n] has a total of N/2 samples):

$$x[2n] \Leftrightarrow X[k] + X[k+N/2]$$

$$k=0,1,\ldots N/2-1 \qquad \text{Eqn[2]}$$

Figure 6A:
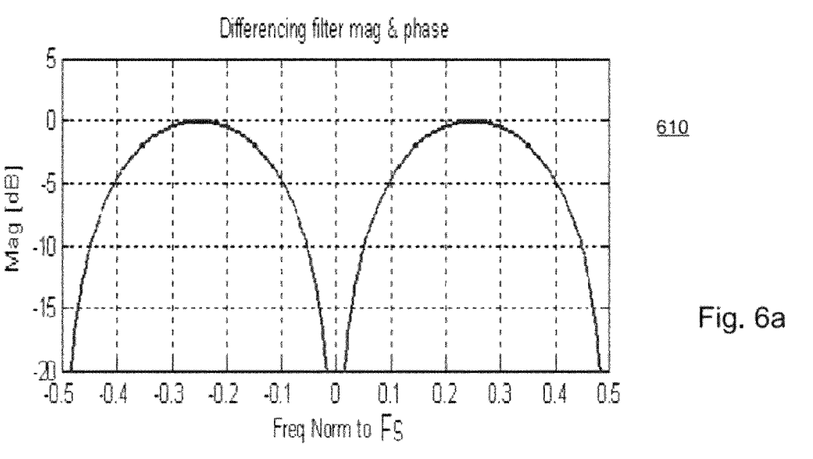
FIGS. 6(a) and 6(b) illustrate magnitude and phase response plots, respectively, consistent with an aspect of the present disclosure.
Figure 6B:
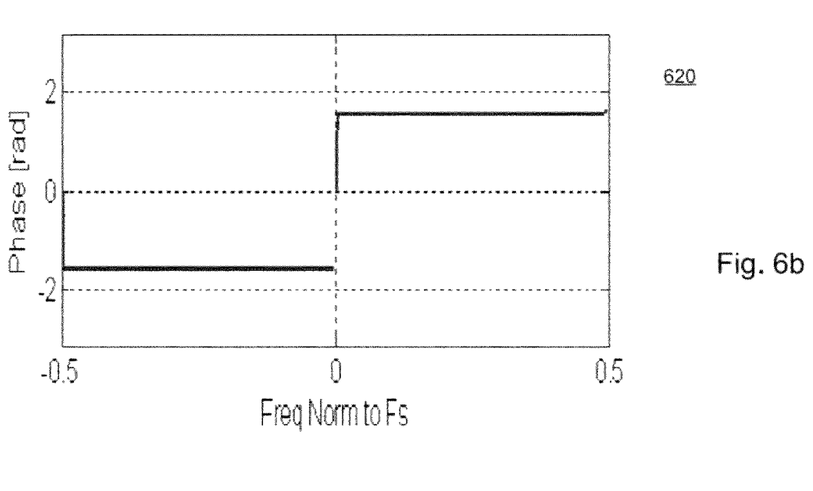

The differencing function in Eqn[1] (i.e., the quantity "x(2n−1)−x(2n+1)", can be considered a filtering function on the signal x[n]. The result of the filtering function quantity has both imaginary (Im) and real (Re) parts. The sum of $Im^2$ and $Re^2$ yields the magnitude of the filtering function quantity. Plot 610, shown in FIG. 6a, illustrates such magnitude as function of frequency or the "magnitude response" normalized to the sampling frequency Fs (also referred to as fs). The phase of the filtering function quantity is arctan(Im/Re). Plot 620 in FIG. 6b illustrates such phase as a function frequency or the "phase response" normalized to Fs.

The filtering function can be approximated with a function H[k], where H[k] has a flat magnitude response and only the phase response (+j & −j) is retained.

$$H[k] = \begin{cases} +j & \text{where } k = 0 \to N/2 - 1 \\ -j & \text{where } k = N/2 \to N - 1 \end{cases} \qquad \text{Eqn[3]}$$

Using the properties in Eqn[2] and Eqn[3], the differencing function in Eqn[1] (x(2n−1)−x(2n+1)) can be written in the frequency domain through the following derivation:

$$x[n-1] - x[n+1] \Leftrightarrow X[k] \cdot H[k]$$

$$x[2n-1] - x[2n+1] \Leftrightarrow X[k] \cdot H[k] + X[k+N/2] \cdot H[k+N/2] \qquad \text{Eqn[4]}$$

Another discrete time Fourier property (assume A[k] is the FFT of a[n], and B[k] the FFT of b[n]) is:

$$\sum_N a[n] \cdot b^*[n] \Leftrightarrow \sum_N A[k] \cdot B^*[k] \qquad \text{Eqn[5]}$$

Using Eqn[2], Eqn[4] and Eqn[5], the frequency domain equivalent function of Eqn[1] can be derived, as follows:

$$\sum_N (x[2n-1] - x[2n+1]) \cdot x^*[2n] \Leftrightarrow \qquad \text{Eqn[6]}$$
$$\sum_K (X[k] \cdot H[k] + X[k+N/2] \cdot H[k+N/2]) \cdot$$
$$(X^*[K] + X^*[K+N/2])$$

Eqn[6], however, can be simplified in light of the definition of H[k] definition in Eqn[3]. Namely, since H[k] is a differencing filter, and the magnitude response passes frequencies near +/−fbaud/2 (or +/−fs/4 for 2 samples per symbol, (where fbaud is the symbol rate carried by the optical signal, which is also the symbol rate associated with the time domain data noted above), the summation over all frequencies k in Eqn[7] below may be reduced to a summation over a selected portion of the frequencies near +/−fbaud/2, and the result should be the same or substantially as summing over all frequencies. With this simplification, phase detector 541 may be made more computationally efficient. For example, if Fourier transform block 528 has 256 outputs 504-1 to 504-n (also frequency bins or "points"), those outputs associated with frequency domain data components centered at +fbaud/2 and 32 bins centered at −fbaud/2 are sufficient to detect the phase. Accordingly, as noted above, not all the frequency domain data components on outputs 504-1 to 504-n need to be supplied to phase detector 541. Rather, a subset of such components, e.g., those supplied by output 505-1 to 505-m are provided to phase detector circuit 541, and the phase error, $\tau_{err}$, may be expressed as follows:

$$\tau_{err} = \sum_K j \cdot (X[k] - X[k+N/2]) \cdot (X^*[K] + X^*[K+N/2]) \qquad \text{Eqn[7]}$$

Eqn[7] is a frequency domain implementation of Gardner's time domain phase detector. Multiplying out the product terms, Eqn[7] can be equivalently expressed as:

$$\tau_{err} = \sum_K j \cdot (|X[k]|^2 - |X[k+N/2]|^2) - 2 \cdot \text{Im}\{X[k]X^*[K+N/2]\} \qquad \text{Eqn[8]}$$

The first term in Eqn[8] is imaginary and does not contribute to clock phase information, and the second term is entirely real, and contains clock phase information. Thus, Eqn[7] may be modified by taking the real component before summation:

$$\tau_{err} = \sum_{K} \text{Re}\{j \cdot (X[k] - X[k+N/r]) \cdot (X^*[K] + X^*[K+N/r])\} \quad \text{Eqn}[9]$$

where r=2, N is a number of the plurality of FFT 528 outputs 504-1 to 504-n, K is an integer less than or equal to N and may be a number of the subset of outputs 505-1 to 505-m, k is an integer from 1 to K, inclusive, X[k] is a value of a kth one of the plurality of frequency components, X*[k] is a complex conjugate X[k], X[k+N/2] is a value of a (k+N/2)th one of the plurality of frequency components, and X*[k+N/2] is a complex conjugate of X[k+N/2], and r is a number of samples that the ADC circuitry (e.g., one or more of circuits 418, 420, 422, and 424) outputs per symbol of the time domain data or data signal. In Eqn[9], r may be an integer other than 2 and K may be less than N.

Figure 7:
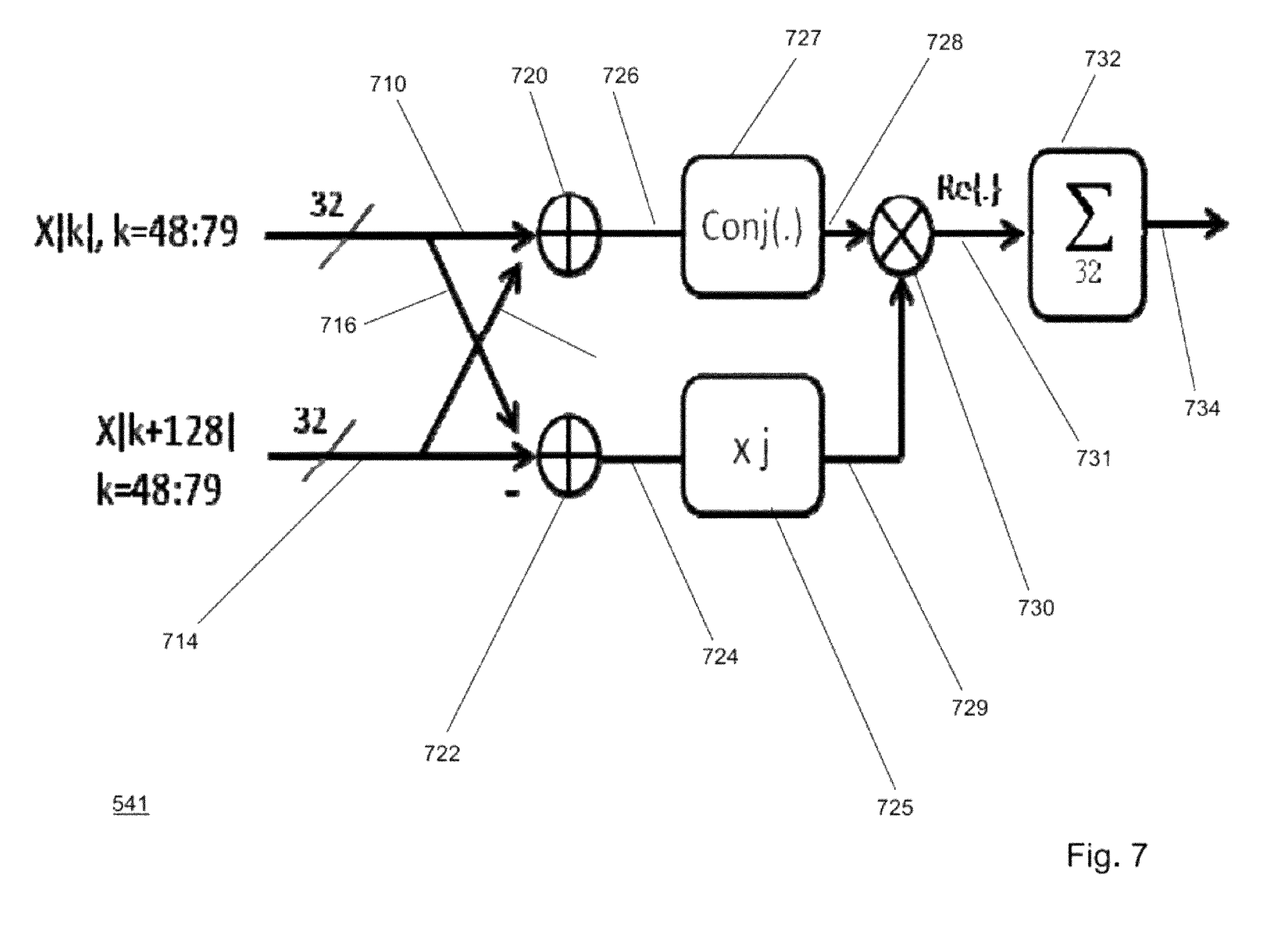
FIG. 7 illustrates an example of a phase detector circuit consistent with a further aspect of the present disclosure.

FIG. 7 illustrates an example of a circuit that implements Eqn[9]. Here, 64 outputs (505-1 to 505-m, m=64) of FFT 528 supply frequency domain data components ("frequency bins") to phase detector 541. The output of phase detector 541 is indicative of phase error, $\tau_{err}$, or the phase between the clock signal and the information signal carried by the optical signal supplied to PBS 302 (see FIG. 3). The phase error may be integrated in a feedback PLL clock recovery loop 551 (see FIG. 5) to adjust the frequency and/or timing of the clock signal output from VCO 545 to control the frequency and/or timing of sampling performed by ADC circuits 418, 420, 422, and 424. VCO 545 may be integrated or housed with other circuit parts shown in FIG. 5, or may be housed separately.

As shown in FIG. 7, phase detector circuit 541 includes a first input 710 receiving first data (e.g., first frequency domain data output from Fourier transform block 528) including a first plurality of values (e.g., frequency domain data components supplied by first selected ones of outputs 505-1 to 505-m). Phase detector 541 also includes a second input 712 that receives second data (e.g., second frequency domain data output from Fourier transform block 528) including a second plurality of values (e.g., frequency domain data components supplied by second selected ones of outputs 505-1 to 505-m). In one example, the Fourier transform block 528 has 256 outputs or frequency bins, each of which supplying a corresponding one of a plurality of frequency components (or frequency domain data components). The first input 710, however, receives 32 of these frequency bins, such as bins 48 to 79, and the second input receives bins 176 to 207, such that a subset of the total number of frequency bins (64 of the 256) are provided to phase detector 541.

Phase detector circuit 541 also includes a first adder or adder circuit 720, which is configured to add the first data to the second data and to generate a first output 726 corresponding to a sum of the first and second data. In addition, phase detector circuit 541 includes a second adder or adder circuit 722 configured to add the first data to negated second data to generate a second output 724 corresponding to a difference between the first and second data.

A conjugating circuit 727 is also provided that is configured to generate a third output 728 corresponding to a conjugation of the sum of the first and second data. Moreover, a first multiplier circuit 725 is provided that is configured to generate a fourth output 729 indicative of a product of an imaginary number and the difference between the first and second data (output 724).

A second multiplier circuit 730 is provided that is configured to generate a fifth output 731 indicative of a product of the third (728) and fourth (729) outputs, the fifth output (731) also being indicative of a plurality real values. In this example, a number of the plurality of real values is 32. As further shown in FIG. 7, summation circuit 732 is also provided that is configured to provide a sixth output 734 indicative of a summation of the plurality of real values. Sixth output 734 of phase detector 741 is also indicative of the phase error, $\tau_{err}$, or the phase between the clock signal and the information signal carried by the optical signal supplied to PBS 302 (see FIG. 3).

In the above example, the inputs to phase detector 741 are provided from Fourier transform block 528 and are associated with light have the Y (TM) polarization noted above. Thus, for example, X[k] and X[k+N/r] in Eqn[9] may be frequency domain data or frequency components provided by block 528. It is understood, however, that phase detector circuit 741 could also determine the phase based on selected outputs (503-1 to 503-n) and frequency domain data components of Fourier transform block 526 associated with light having the X (TE) polarization, e.g., X[k] and X[k+N/r] in Eqn[9] are frequency domain data or frequency components provided by block 526. Alternatively X[k] and X[k+N/r] in Eqn[8] may be a linear combination of frequency domain data or frequency components provided by blocks 526 and 528, such as a sum of selected frequency components supplied by blocks 526 and 528.

Figure 8:
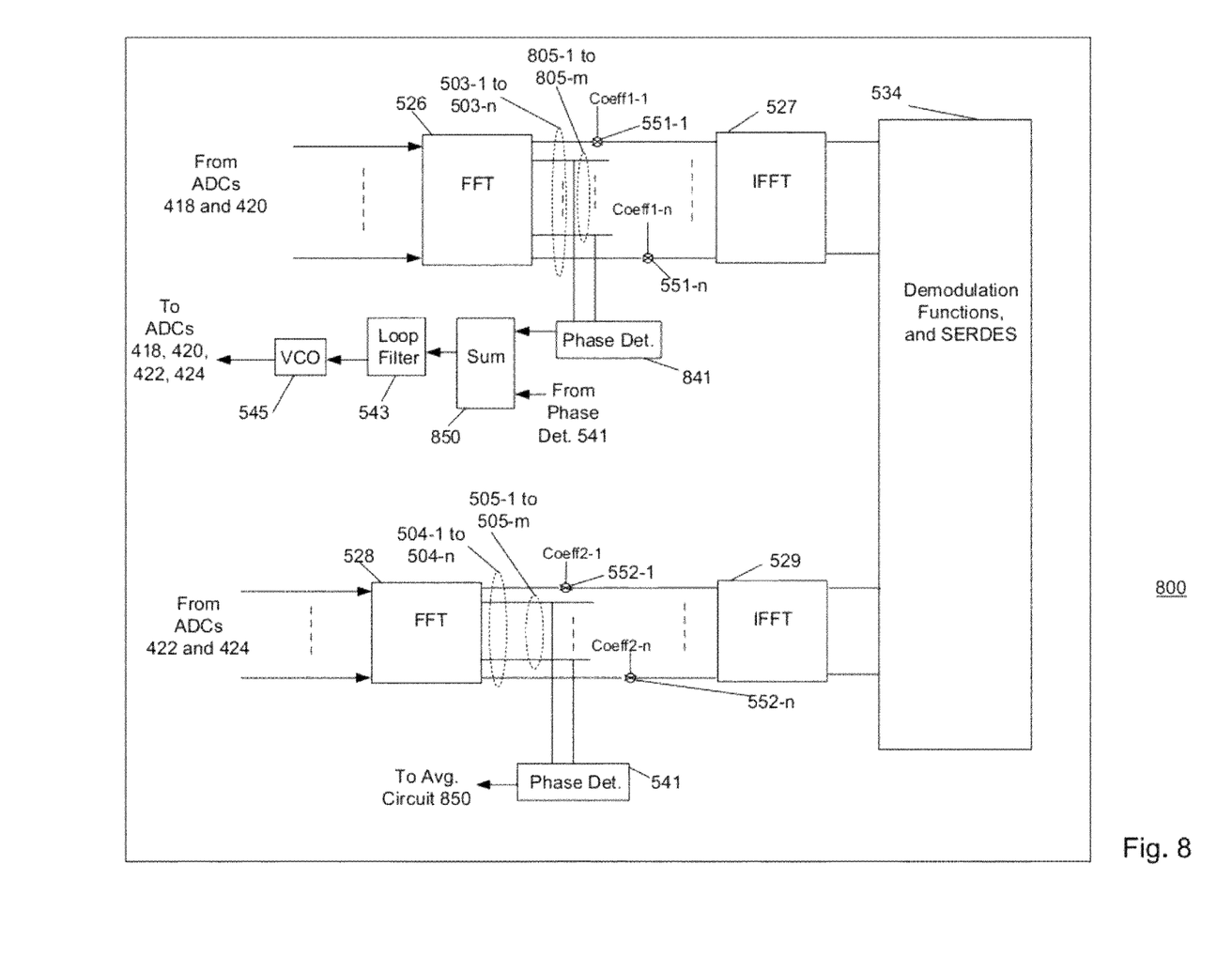
FIG. 8 illustrates an additional example of a circuit block consistent with the present disclosure.

FIG. 8 illustrates circuit block 800, which is similar to circuit block CB4-1 discussed above. Circuit block 800, however, includes an additional phase detector circuit 841, which has the same or similar structure and operation of phase detector 541, but receives selected outputs 805-1 to 805-m from block 526. As noted above, the frequency components output from block 526 correspond to or are associated with the portion of the optical signal having a TE polarization, while the frequency components output from block 528 correspond to or are associated with the portion of the optical signal having a TM polarization.

As further shown in FIG. 8, the outputs of phase detector circuits 541 and 841 are provided to a summer circuit 850, which supplies an output indicative of an average phase difference between the outputs of circuits 541 and 841. The output of summing circuit 850 may likewise be supplied to loop filter 543 and subject to similar processing as that described above with reference to FIG. 5 in connection with the output of phase detector 541. Accordingly, loop filter 543 and VCO 545 shown in FIG. 8 operate in a manner similar to that discussed above to generate a clock signal that is supplied to one or more ADCs 418, 420, 422, and 424. Thus, the clock signal is in accordance with the output of the summing circuit 850.

Figure 9:
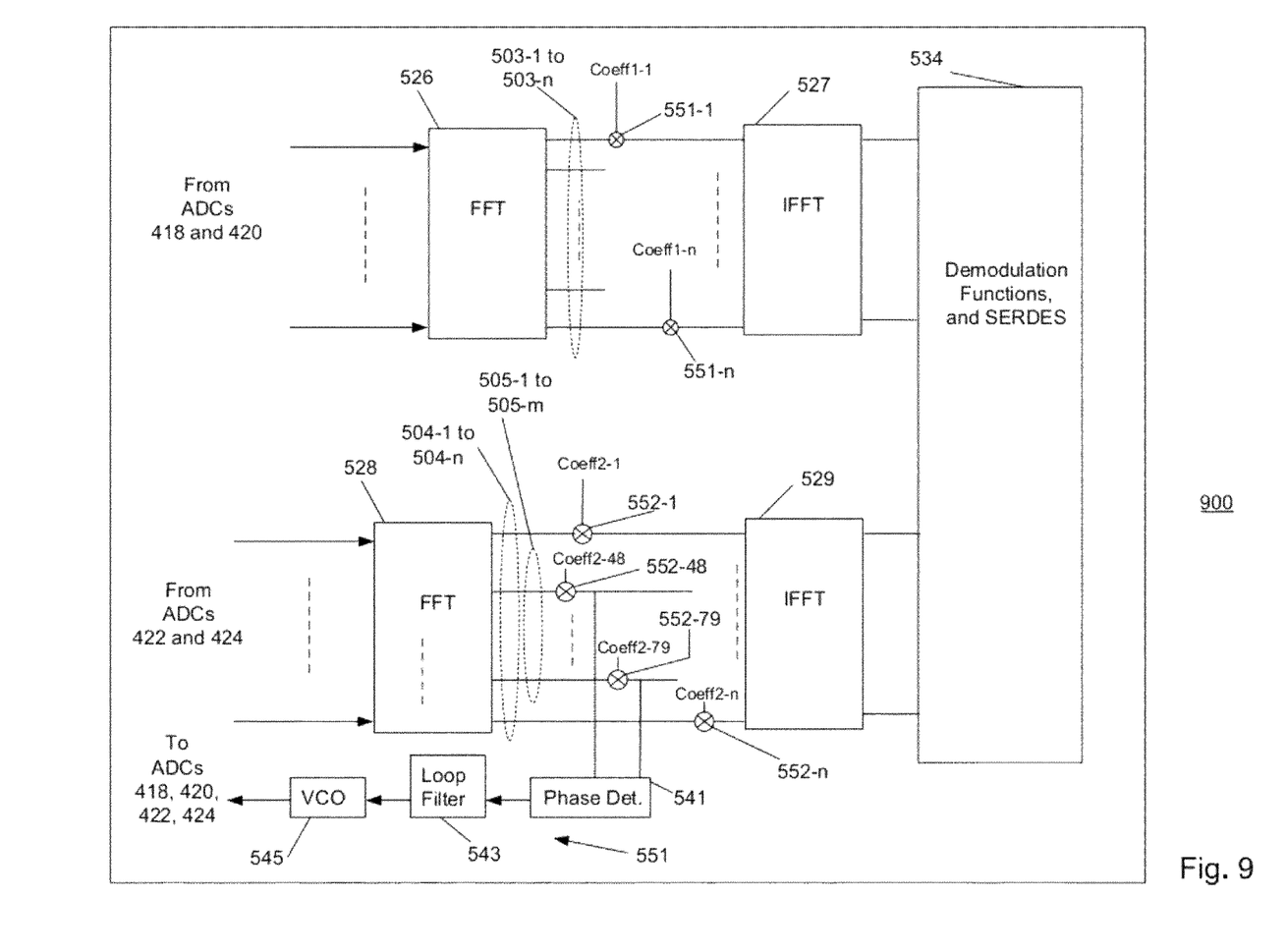
FIG. 9 illustrates a further example of a circuit block consistent with the present disclosure.

FIG. 9 illustrates circuit block 900 consistent with a further aspect of the present disclosure. Circuit block 900 is similar to circuit block CB-4 discussed above. However, in circuit block 900, selective outputs or frequency components 505-1 to 505-m may be supplied to corresponding ones of multiplier circuits 552-48 to 552-79 to supply corresponding ones of a plurality of frequency products. Such frequency products may, in turn, be supplied to phase detector 541 to generate an output indicative of the phase difference discussed above. As further shown in FIG. 9, each of multiplier circuits 552-48 to 552-79 receives a corresponding one of coefficients Coeff2-48 to Coeff2-79.

Thus, in the example shown in FIG. 9, phase detector 541 receives the products of the frequency components or frequency bins multiplied by coefficients, whereas in FIG. 5, selected frequency bins were supplied to phase detector 541 prior to such multiplication. As further noted above, multiplier circuits 552 act to provide dispersion compensation, and therefore, in the example shown in FIG. 9 phase detector 541 can provide suitable outputs over a wide range of chromatic dispersion.

As noted above, phase detector 741 (as well as phase detector 841) generates phase data for adjusting the sample timing of ADC circuits 418, 420, 422, and 424. Such phase data is calculated based on a limited number of frequency bins of a Fourier transform circuit, and thus phase detector 741 is computationally efficient, has a simpler design, and operates relatively fast.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus, comprising:
   photodetector circuitry configured to receive an optical signal and supply an analog electrical signal, the optical signal carrying a series of symbols constituting an information signal;
   analog-to-digital conversion (ADC) conversion circuitry configured to supply a digital signal in accordance with the analog electrical signal and a sampling frequency, the digital signal carrying time domain data;
   a Fourier transform circuit configured to supply a plurality of frequency domain components in accordance with the digital signal;
   a plurality of multiplier circuits, each of which being configured to multiply a corresponding one of a subset of the plurality of frequency domain components by a respective one of a plurality of coefficients to supply a corresponding one of a plurality of frequency products;
   a phase detector circuit configured to supply an output indicative of a phase between with the clock signal and the information signal, the output being supplied in response to the plurality of frequency domain products; and
   a clock circuit configured to supply the clock signal in accordance with the output of the phase detector circuit.

2. An apparatus in accordance with claim 1, further including a filter circuit that receives and filters the output of the phase detector circuit and supplies an input to the clock circuit.

3. An apparatus in accordance with claim 1, wherein the clock circuit includes a voltage controlled oscillator circuit.

4. An apparatus in accordance with claim 1, wherein the Fourier transform circuit includes a Fast Fourier transform circuit.

5. An apparatus in accordance with claim 1, wherein an error of the phase, $\tau_{err}$, satisfies:

$$\tau_{err} = \sum_K \text{Re}\{j \cdot (X[k] - X[k+N/r]) \cdot (X^*[k] + X^*[k+N/r])\}$$

wherein the Fourier transform circuit has a plurality of outputs, each of which supplying a corresponding one of a plurality of frequency components, collectively, the frequency domain components constituting the frequency domain data, such that N is a number of the plurality of outputs, K is an integer less than or equal to N, k is an integer from 1 to K, inclusive, $X[k]$ is a value of a kth one of the plurality of frequency components, $X^*[k]$ is a complex conjugate $X[k]$, $X[k+N/2]$ is a value of a (k+N/2)th one of the plurality of frequency components, and $X^*[k+N/2]$ is a complex conjugate of $X[k+N/2]$, and r is a number of samples that the ADC circuitry outputs per symbol of the data signal.

6. An apparatus in accordance with claim 5, wherein r=2.

7. An apparatus in accordance with claim 5, wherein K is less than N.

8. An apparatus in accordance with claim 5, wherein the optical signal includes first light having a first polarization and second light having a second polarization, the first light carrying a first portion of information and the second light carrying a second portion of the information, the Fourier transform circuit includes a first Fourier transform block and a second Fourier transform block, the first Fourier transform block supplying first ones of the plurality of frequency components associated with the first light and the second Fourier transform block second ones of the plurality of frequency components associated with the second light, $X[k]$ and $X[k+N/r]$ including the first ones of the plurality of frequency components.

9. An apparatus in accordance with claim 5, wherein the optical signal includes first light having a first polarization and second light having a second polarization, the first light carrying a first portion of information and the second light carrying a second portion of the information, the Fourier transform circuit includes a first Fourier transform block and a second Fourier transform block, the first Fourier transform block supplying first ones of the plurality of frequency components associated with the first light and the second Fourier transform block second ones of the plurality of frequency components associated with the second light, $X[k]$ and $X[k+N/r]$ including selected first and second ones of the plurality of frequency components.

10. An apparatus in accordance with claim 9, wherein $X[k]$ and $X[k+N/r]$ include a linear combination of the selected first and second ones of the plurality of frequency components.

11. An apparatus in accordance with claim 10, wherein the linear combination of the selected first and second ones of the plurality of frequency components is a sum of the selected first and second ones of the plurality of frequency components.

* * * * *